US012660304B2

(12) United States Patent     (10) Patent No.:     US 12,660,304 B2
Bomberger et al.                  (45) Date of Patent:     Jun. 16, 2026

(54) TRANSISTORS WITH DOPED INTRINSIC GERMANIUM CAPS ON SOURCE DRAIN REGIONS FOR IMPROVED CONTACT RESISTANCE

(71) Applicant: Intel Corporation, Santa Clara, CA (US)

(72) Inventors: Cory C. Bomberger, Portland, OR (US); Nicholas Minutillo, Beaverton, OR (US); Ryan Cory Haislmaier, Albuquerque, NM (US); Yulia Tolstova, Hillsboro, OR (US); Yoon Jung Chang, Hillsboro, OR (US); Tahir Ghani, Portland, OR (US); Szuya S. Liao, Zhubei City (TW); Anand Murthy, Portland, OR (US); Pratik Patel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 439 days.

(21) Appl. No.: 17/561,244

(22) Filed: Dec. 23, 2021

(65) Prior Publication Data

US 2023/0207560 A1     Jun. 29, 2023

(51) Int. Cl.
*H10D 84/83*     (2025.01)
*H10D 30/01*     (2025.01)
(Continued)

(52) U.S. Cl.
CPC ......... *H10D 84/834* (2025.01); *H10D 30/024* (2025.01); *H10D 30/6211* (2025.01);
(Continued)

(58) Field of Classification Search
CPC ............. H10D 30/6211; H10D 84/013; H10D 84/0158; H10D 62/235; H10D 62/834;
(Continued)

(56) References Cited

U.S. PATENT DOCUMENTS

2015/0041852 A1*   2/2015   Kwok .................. H10D 64/259
                                                      257/190
2019/0189755 A1    6/2019   Glass et al.
                   (Continued)

OTHER PUBLICATIONS

Seiichi Shishiguchi, Akira Mineji and Tomoko Matsuda, Optimized Source/Drain Ion Implantation Conditions for P-Channel MetalâOxideâSemiconductor Field-Effect-Transistor Formation, Published Dec. 10, 2003, Japanese Journal of Applied Physics, vol. 42, No. 12R (Year: 2003).*

(Continued)

*Primary Examiner* — Matthew C Landau
*Assistant Examiner* — Vincent Kipkemoi Rono
(74) *Attorney, Agent, or Firm* — Alliance IP, LLC

(57)     ABSTRACT

An integrated circuit (IC) structure, an IC device, an IC device assembly, and a method of forming the same. The IC structure includes a transistor device on a substrate comprising: a gate structure including a metal, the gate structure on a channel structure; a source structure in a first trench at a first side of the gate structure; a drain structure in a second trench at a second side of the gate structure; a capping layer on individual ones of the source structure and of the drain structure. The capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and metal contact structures coupled to respective ones of the source structure and of the drain structure.

25 Claims, 10 Drawing Sheets

(51) Int. Cl.

| | |
|---|---|
| *H10D 30/62* | (2025.01) |
| *H10D 62/13* | (2025.01) |
| *H10D 62/17* | (2025.01) |
| *H10D 62/834* | (2025.01) |
| *H10D 84/01* | (2025.01) |
| *H10D 84/03* | (2025.01) |

(52) U.S. Cl.
CPC ......... *H10D 62/151* (2025.01); *H10D 62/235* (2025.01); *H10D 62/834* (2025.01); *H10D 84/0128* (2025.01); *H10D 84/013* (2025.01); *H10D 84/0158* (2025.01); *H10D 84/038* (2025.01)

(58) Field of Classification Search
CPC ............... H10D 30/024; H10D 62/151; H10D 84/0128; H10D 84/038
See application file for complete search history.

(56) References Cited

U.S. PATENT DOCUMENTS

| | | | |
|---|---|---|---|
| 2019/0348415 A1* | 11/2019 | Sung | ............. H10D 30/6735 |
| 2019/0378928 A1 | 12/2019 | Liu et al. | |
| 2020/0312842 A1 | 10/2020 | Keech et al. | |
| 2021/0210350 A1 | 7/2021 | Chen et al. | |
| 2021/0376101 A1 | 12/2021 | Wang et al. | |

OTHER PUBLICATIONS

Choi, Yang-Kyu, et al., "30nm ultra-thin-body SOI MOSFET with selectively deposited Ge raised S/D," 58th DRC (IEEE); Feb. 2020; University of California; Berkeley, CA; 3 pages.
EPO European Extended Search Report in EP Application Serial No. 22201538.0 mailed on May 19, 2023, 7 pages.
EPO Communication Pursuant to Article 94(3) EPC in EP Application Serial No. 22201538.0 mailed on Jul. 29, 2025, 6 pages.

* cited by examiner

204

202

$Si_{70}Ge_{30}$
Channel
Layers

Si Substrate

207'

207"

206

208

207

206

Si

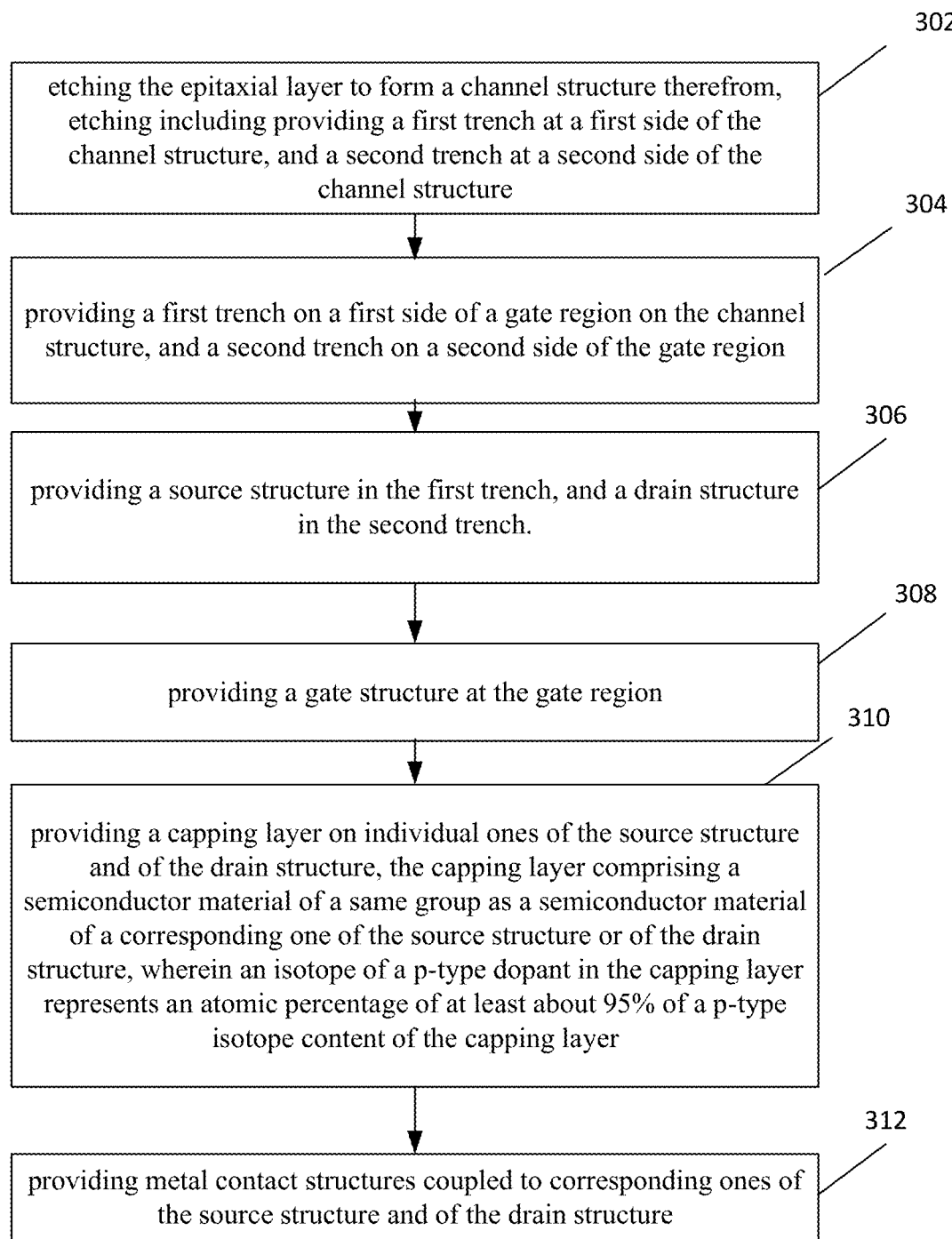

302 etching the epitaxial layer to form a channel structure therefrom, etching including providing a first trench at a first side of the channel structure, and a second trench at a second side of the channel structure

304 providing a first trench on a first side of a gate region on the channel structure, and a second trench on a second side of the gate region

306 providing a source structure in the first trench, and a drain structure in the second trench.

308 providing a gate structure at the gate region

310 providing a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer

312 providing metal contact structures coupled to corresponding ones of the source structure and of the drain structure

FIG. 3

TRANSISTORS WITH DOPED INTRINSIC GERMANIUM CAPS ON SOURCE DRAIN REGIONS FOR IMPROVED CONTACT RESISTANCE

TECHNICAL FIELD

The disclosure is in the field of advanced integrated circuit structure fabrication, for example 10 nanometer node and smaller integrated circuit structure fabrication and the resulting structures.

BACKGROUND

Semiconductor devices are electronic components that exploit the electronic properties of semiconductor materials, such as silicon (Si), germanium (Ge), and silicon germanium (SiGe). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to asap-channel device. Standard dopant used for Si, Ge, and SiGe includes boron (B) for p-type (acceptor) dopant and phosphorous (P) or arsenic (As) for n-type (donor) dopant. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (p-MOS) and n-channel MOSFET (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

Transistor configurations are needed that exhibited improved contact resistance, such as in FinFET devices as described above.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 is a flow chart of another process according to an embodiment.

DESCRIPTION OF EMBODIMENTS

Figure 1:
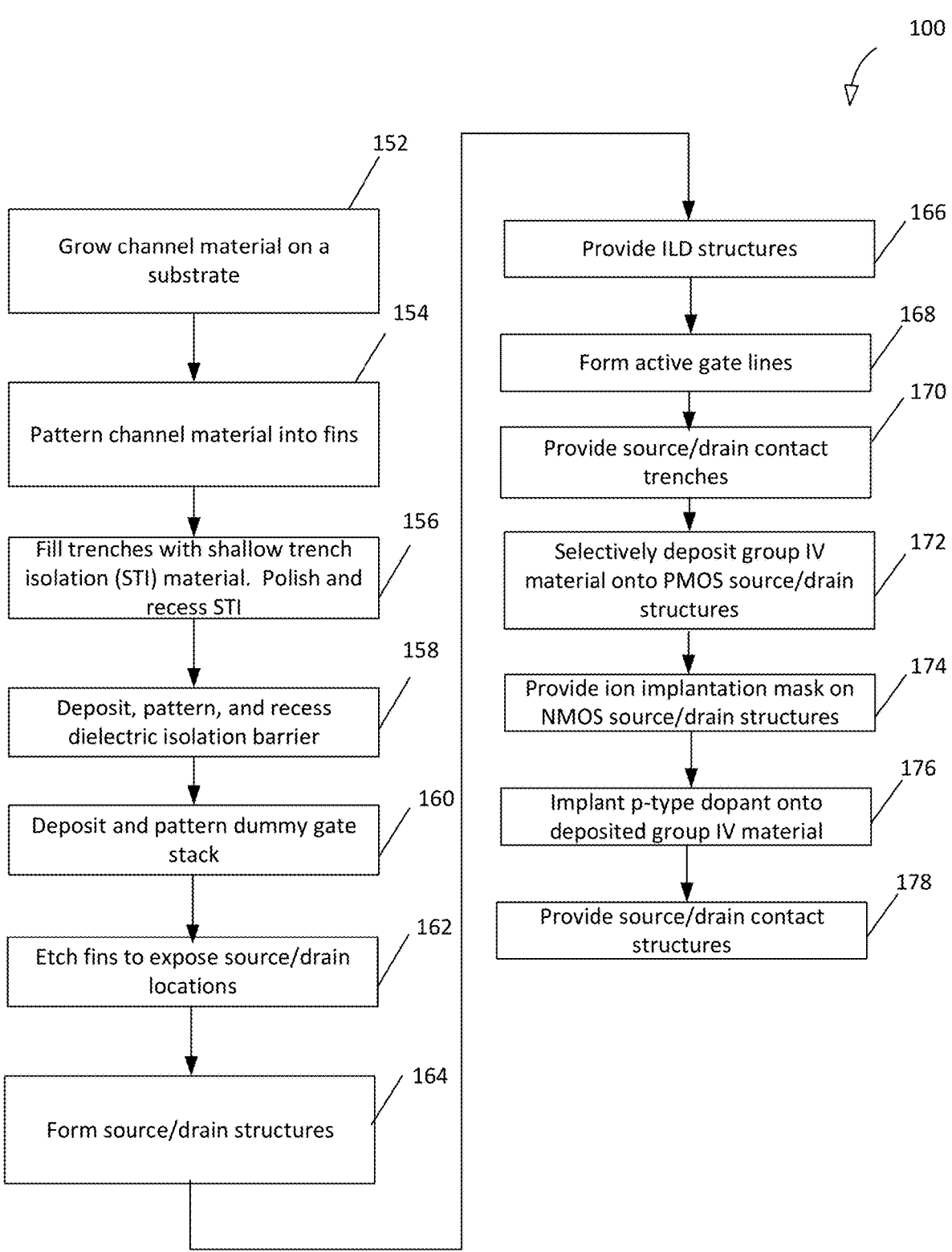
FIG. 1 is a flow chart of a process according to an embodiment.

The contact resistance between the source/drain and the contact metal as well as spreading resistance within the source drain will be increased by the small contact areas due to shrinking cell heights. This result in increased external resistance, and becomes an increasing problem as dimensions are reduced with scaling.

A fundamental limit in current solutions to address the resistance between the source/drain regions and the contacts in an integrated circuit structure resides in how low the resistance of the source/drain material can be without changing the source/drain material to a metal, which leads to new issues including introducing a barrier between the channel and the source/drain, as well creating an easy leakage path between the gate and the source/drain contact. In addition, current PMOS source drain materials are typically limited to $Si_{(1-x)}Ge_x$:B with X<0.6. However, the latter, if deposited in the mid-section during the main source/drain deposition, can be attacked by downstream etches, and be easily damaged or completely removed. Similarly, Ge:B deposited as a cap in the mid-section at the main source/drain location in the flow does not survive downstream processing. Patterning the device for Ge:B deposition when the source/drain is opened for metal contact faces the integration challenge of preventing Ge:B on NMOS while keeping Ge:B on the PMOS at end of line.

To address the above problems, some embodiments provide a method of making an integrated circuit device, such as a transistor device as follows: a standard epitaxial source/drain deposition would occur in the midsection, and the fabrication of the corresponding transistor device would continue as normal until just after the source/drain (for either NMOS or PMOS) is opened back up to create the source/drain contact structures. An intrinsic Ge film may then be deposited under chamber conditions that cause the Ge to grow only on the exposed PMOS source/drain structures and not on the exposed NMOS source/drain structures or other oxides/nitrides. To prevent the total PMOS source/drain structures from being too tall, either the upfront source/drain deposition may form shorter source/drain structures, or the contact etches prior to the Ge deposition may be slightly longer to extend into corresponding ones of the source/drain structures to a depth below a lower surface of the gate structure. p-dopants are then ion-implanted into both the PMOS and NMOS source drains. With the proper ion-implant conditions, the Ge layer on the PMOS source/drains can be doped enough to provide low contact resistance. For example, the Ge may be doped to include a boron isotope content with an atomic percentage of boron 11 of at least about 95%. The NMOS contact resistance is minimally degraded or not degraded due to the excessive number of n-dopants compared to the small number of p-type dopants. Alternatively, standard ion-implant masks can be used to completely prevent p-dopants from entering the NMOS locations. Ion-implant masks do not require the same stability as a mask that must remain intact in an epitaxial deposition environment which are at substantially higher temperatures. They are therefore easier to etch off without also removing the Ge:B film. After implant, the typical contact layers (Ni, Ti, TiN, and contact metal) may be deposited.

The presence of a Ge:B cap will be detectable with secondary ion mask spectroscopy (SIMS), atom probe tomography (APT), and cross-sectional transmission electron microscopy (X-TEM) with energy dispersive X-ray (EDX). SIMS can distinguish the difference between epitaxially deposited Ge:B and Ge implanted with B by the relative amounts of B isotopes. Implant results in only 11B, where epitaxial deposition results in both 11B and 10B. Additionally, if patterning is not used, small amounts of P-type dopants can be detected in the NMOS region with SIMS, APT, and EDX.

This method of achieving Ge:B caps can be used for both PMOS and CMOS transistors. It may be used for planar transistors, FinFETs, nanowires/ribbons, stacked nanowires/ribbon, stacked CMOS, TunelFETs, MOSFETs, etc. Embodiments may also be implemented for transistors with the channel made from Si, strained Si, relaxed or strained SiGe, relaxed or strained Ge, SiGeSn, GeSn, or III-Vs. Embodiments may also be implemented in transistors with the entire source/drain structure deposited during trench context (TCN) etch out, process flows of gate first or gate last, transistors where backend contacts are made from the backside of the wafer through-via, and transistors made on the backside of the wafer. An ion-implant mask may be used.

Advantageously, some embodiments aim to reduce the contact resistance of source/drain structures in semiconductor devices, such as in PMOS transistor devices This ultimately leads to an improvement in the external resistance, increased current at operating voltage, and improvement in the transistor's overall performance.

Integrated circuit structures having source/drain structures with a p-doped intrinsic source/drain cap including a group IV material are described.

In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Note that the designation "source/drain" is used herein to refer to either a source or a drain or both, as the regions may be similar in the end structure but be differentiated based on how the device is electrically connected.

Some embodiments aim to improve the resistance between the source/drain regions and the metal contact in an integrated circuit structure. Some embodiments achieve the above aim by providing a boron doped Ge capping layer on PMOS source drain regions of a semiconductor device where boron 11 represents at least 95% of boron isotopes implanted in the capping layer.

Some embodiments may be implemented an integrated circuit structures using a capping layer on the source/drain structures that include epitaxial intrinsic Ge doped with boron, where, within a boron isotope content of the layer. Embodiments however are not limited to the provision of a cap that is made of Ge, but may be implemented in integrated circuits structures where alternative materials used in the cap. Some embodiments described here herein may be implemented in PMOS integrated circuit device structures. Some other embodiments described herein may be implemented in an NMOS integrated circuit device structures.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. 112, sixth paragraph, for that unit or component.

"First," "Second," etc. As used herein, these terms are used as labels for nouns that they precede, and do not imply any type of ordering (e.g., spatial, temporal, logical, etc.).

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

In accordance with one or more embodiments of the present disclosure, silicon germanium (SiGe) channel structures with corresponding boron doped Ge caps or capping layers on the source/drain structures are described, where a capping layer's boron isotope content includes no more than 5% of boron 11 isotope (B11). In an embodiment, low contact resistance is achieved using a doped Ge cap to further improve drive current of the SiGe channel transistors.

In an embodiment, following the opening up of source/drain regions for contact deposition, a capping layer is provided on the source/drain structures, where the capping layer includes a group IV semiconductor material doped with boron, where, of the boron isotope content of the capping layer, at least 95% is made of boron 11. Of the capping layer, no more than 5% is made of boron 10. Such source/drain caps may provide a relatively lower contact resistance between a contact metal and a source/drain structure, which ultimately leads to improved performance.

One or more embodiments described herein are directed to fabrication processes and structures including source/drain structures including respective boron doped Ge capping layers therein, examples of which are described in association with FIGS. 1 and 2A-2L described below.

As an exemplary process flow, FIG. 1 is a flowchart representing various operations in a method of fabricating an integrated circuit structure having source or drain structures including source/drain caps, in accordance with an embodiment of the present disclosure. FIGS. 2A-2K illustrate cross-sectional views representing various operations in a method of fabricating an integrated circuit structure having source/drain caps, corresponding to operations of the flowchart 100 of FIG. 1, in accordance with an embodiment of the present disclosure. FIG. 2K illustrates a cross-sectional view of an integrated circuit structure having source/drain caps each including a group IV material, such as Ge, doped with boron, where the atomic percentage of boron isotopes in the material includes at most 5% boron 10 (B10) In one embodiment, the atomic percentage of boron isotopes in the material includes boron 11 of at least 95%, or of at least about 95%. According to an embodiment, the atomic percentage of boron isotope in the material includes at least 95% boron 11, and at most 5% boron 10.

Figure 2A:
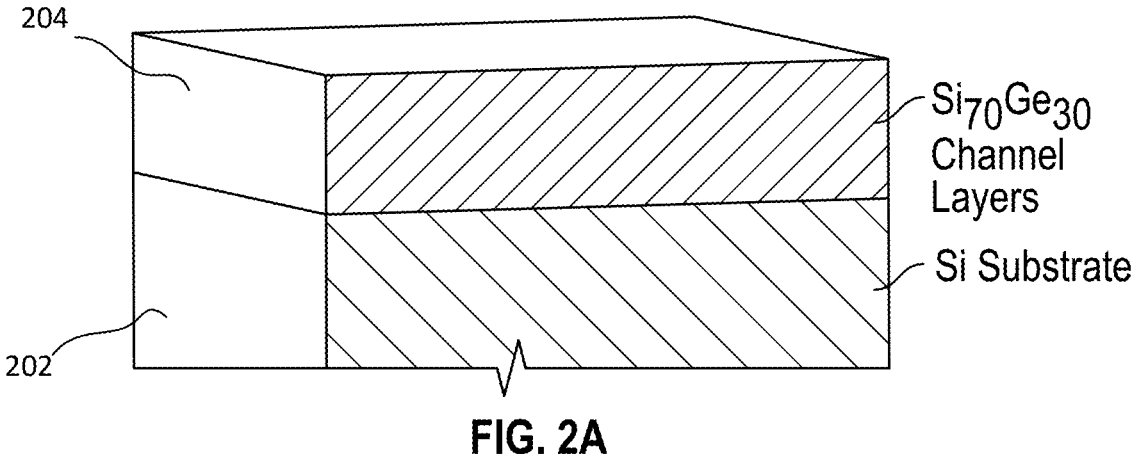
FIGS. 2A-2L are cross-sectional views representing various operations in a method of fabricating an integrated circuit (IC) structure having source/drain structures including a capping layer, in accordance with an embodiment of the present disclosure.

Referring to FIG. 2A, and corresponding to operation 152 of flowchart 100 of FIG. 1, a channel layer 204, for example including silicon and germanium, such as $Si_{70}Ge_{30}$, is grown on a substrate 202, such as a silicon substrate. In one such embodiment, the channel layer 204 may be referred to as a silicon germanium layer or SiGe layer.

Figure 2B:
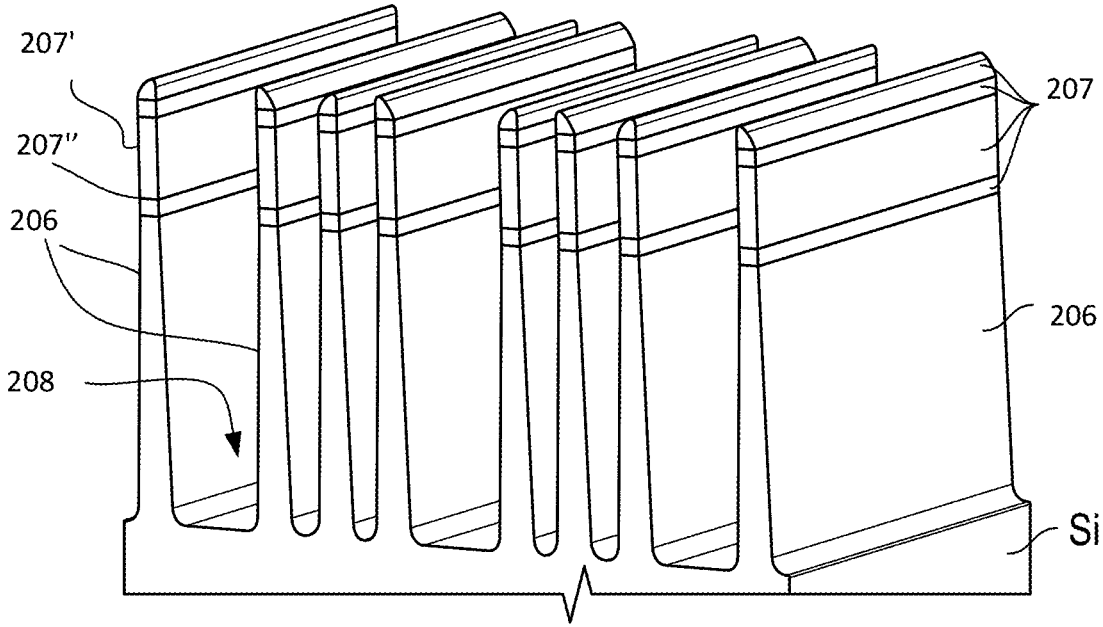

Referring to FIG. 2B, and corresponding to operation 154 of flowchart 100 of FIG. 1, channel layer 204 is patterned into fins 206. According to one embodiment, the patterning may form recesses 208 into channel layer 204, as is depicted, although embodiments are not so limited. For example, the recesses 208 could extend into the substrate 202 (not shown). Patterning of the channel layer 204 into fins 206 may be performed in any well-known manner, such as by way of a lithography and etch process using a mask 207, for example including one layer or multiple mask sublayers as shown.

Figure 2C:
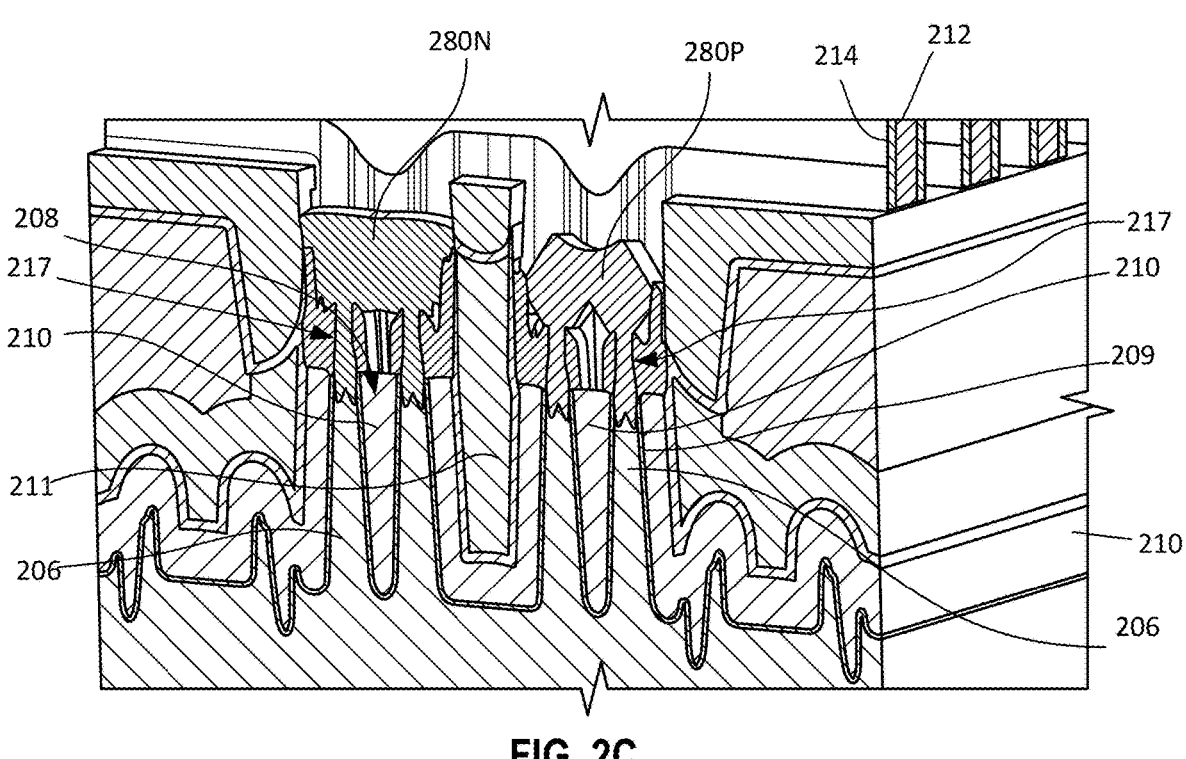
Figure 2D:
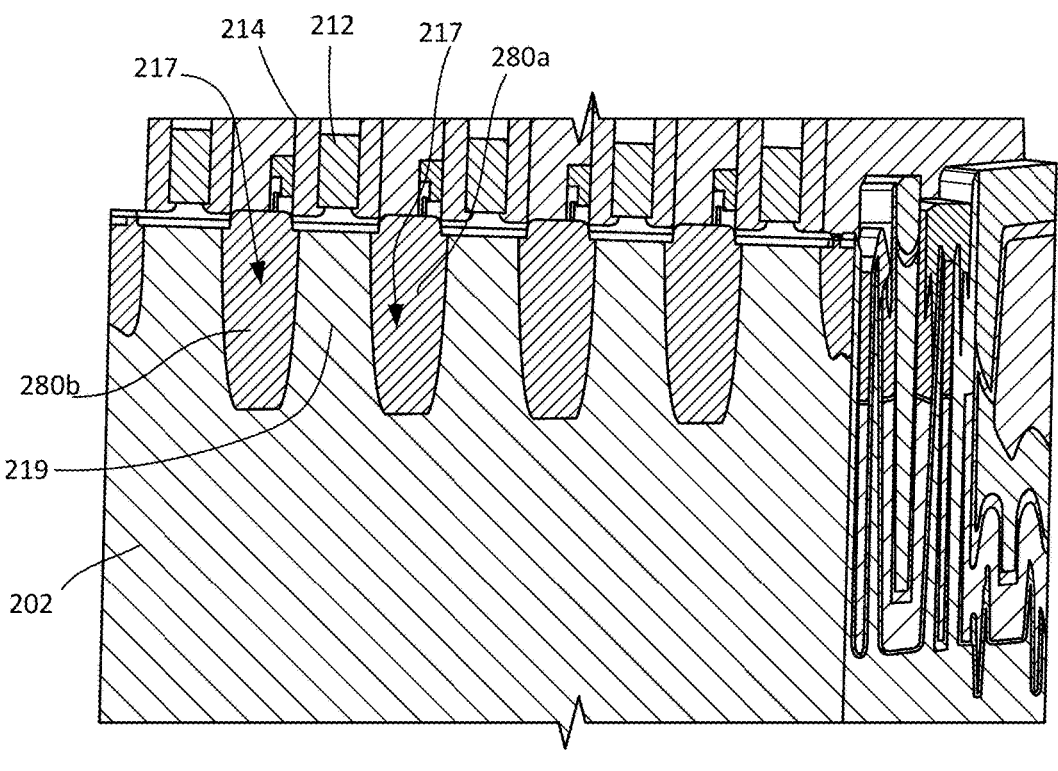

Referring to FIGS. 2C and 2D, where FIG. 2C is a cross section similar to those in FIG. 2B in that it is in the x direction, and where FIG. 2D is a cross section of the structure of FIG. 2C in the y direction, a structure is shown corresponding to implementation of operations 156, 158, 160, 162 and 164 of flowchart 100 of FIG. 1.

At operation 156, trenches between the fins 206 are filled with a shallow trench isolation material which is then polished and recessed to form isolation structures 210 and 211.

At operation 158, after formation of the isolation structures 210, deposition, patterning and recessing of a dielectric isolation barrier (not shown in the figures), such as a dielectric isolation barrier or mask including SiO2, may take place, which barrier may be deposited and patterned on the fins 206.

The process may continue at operation 160 with deposition and patterning of a dummy gate structure 212. The dummy gate structure may, for example, include polysilicon. Forming the dummy gate structures, in accordance with some embodiments may include forming a dummy gate dielectric (e.g., dummy oxide material) and a dummy gate electrode (e.g., dummy poly-silicon material) to be used for replacement gate processing. In some embodiments, dummy gate structure 212 may include any suitable sacrificial material that can be later removed. Dummy gate structure 212, in some embodiments, can be formed using any suitable techniques, such as depositing the material of dummy gate structure 212 and then patterning and etching it to form the structures shown in FIG. 2C. Gate side-wall spacers 214 (see FIG. 2D), referred to herein as gate spacers (or simply, spacers) are also formed on either side of the dummy gate structure 212. Such gate spacers 214 can be formed using any suitable techniques, such as depositing the material of gate spacers 214 and performing spacer pattern and etch processing, for example. In some embodiments, the gate spacers 214 are used to help determine the final gate length and/or channel length, and to help with the replacement gate processing. In some embodiments, gate spacers 214 include any dielectric material, such as an oxide (e.g., silicon dioxide), nitride (e.g., silicon nitride), high-k dielectric, low-k dielectric, and/or any other suitable electrically insulating material as can be understood based on this disclosure. In some embodiments, gate spacers 214 include silicon, oxygen, nitrogen, and/or carbon. For instance, in some embodiments, gate spacers 214 include silicon dioxide, silicon monoxide, silicon nitride, silicon oxynitride, or carbon-doped silicon dioxide (or other carbon-doped oxides). In some embodiments, it is desired to select material for gate spacers 214 that has a low dielectric constant and a high breakdown voltage. In some embodiments, gate spacers 214 include a multilayer structure (e.g., a bilayer structure where the sub-layers are laterally adjacent to each other).

According to one option, the fins 206 may be, as per operation 102 of FIG. 1, further etched down to expose locations for source/drain material deposition, although not shown in FIGS. 2A-2K.

At operation 162, fins 206 are etched to form trenches 217 to expose locations for source/drain deposition. A vertical etch (or a vertical etch undercut (EUC) may be performed through the fins 206 in a direction transverse to recesses 208 between the fins, the EUC to open up source/drain trenches 217 for source/drain structures to be provided therein. In some embodiments, source/drain trenches 217 can be formed using any suitable techniques, such as etching (via wet and/or dry etch processing) fins 206 in the exposed locations.

At operation 164, NMOS and PMOS source/drain structures 280N and 280P are formed. Source/drain structures may be formed by depositing an epitaxial source/drain material. in the trenches 217, and may include a boron-doped epitaxial material, such as a boron doped SiGe material for a PMOS transistor, and a phosphorus doped SiGe material for a NMOS transistor. The Ge atomic percentage of a SiGe material used for the PMOS source/drain material may be about 50% or more. For NMOS transistors, the dopant may be controlled to obtain improved contact resistance without increased possibility of dopant diffusion into the channel regions 219. Source/drain material of capping layers 215, in some embodiments, include a semiconductor material.

In some such embodiments, the source/drain material includes a group IV semiconductor material. In some embodiments, source/drain material of capping layers 215 include one or more of silicon, germanium, tin, carbon, or lead.

Figure 2E:
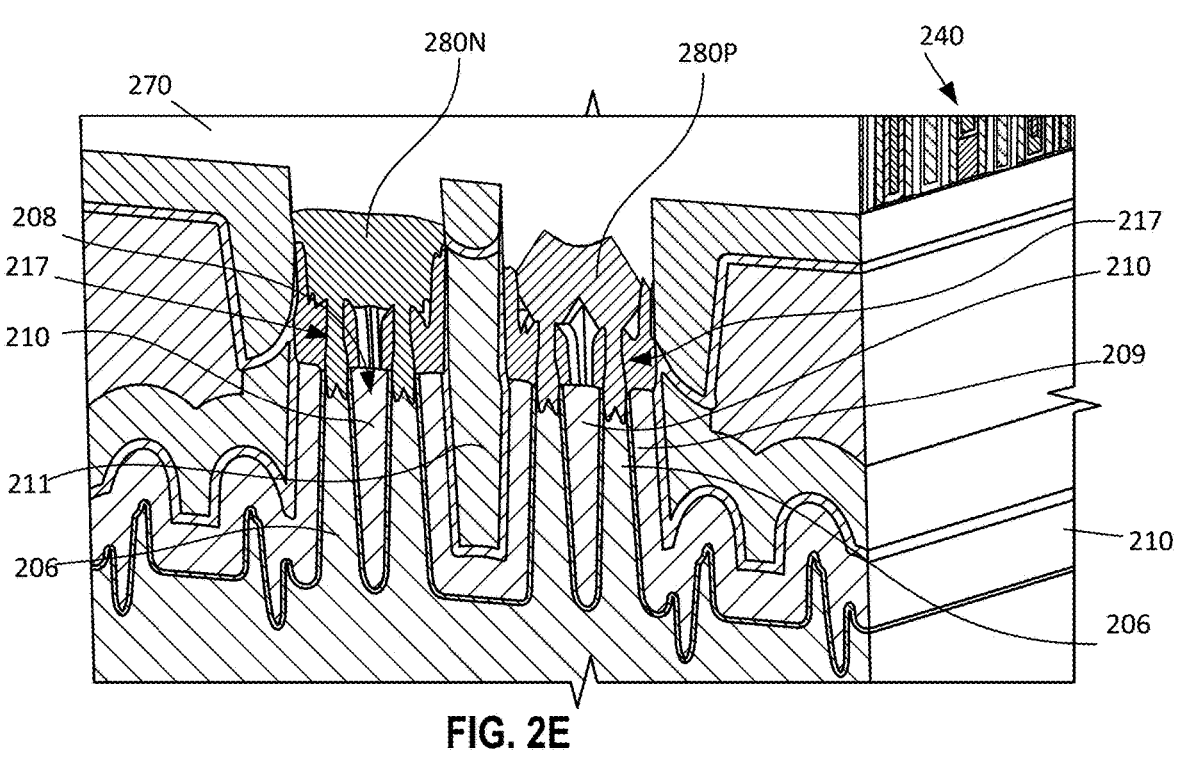
Figure 2F:
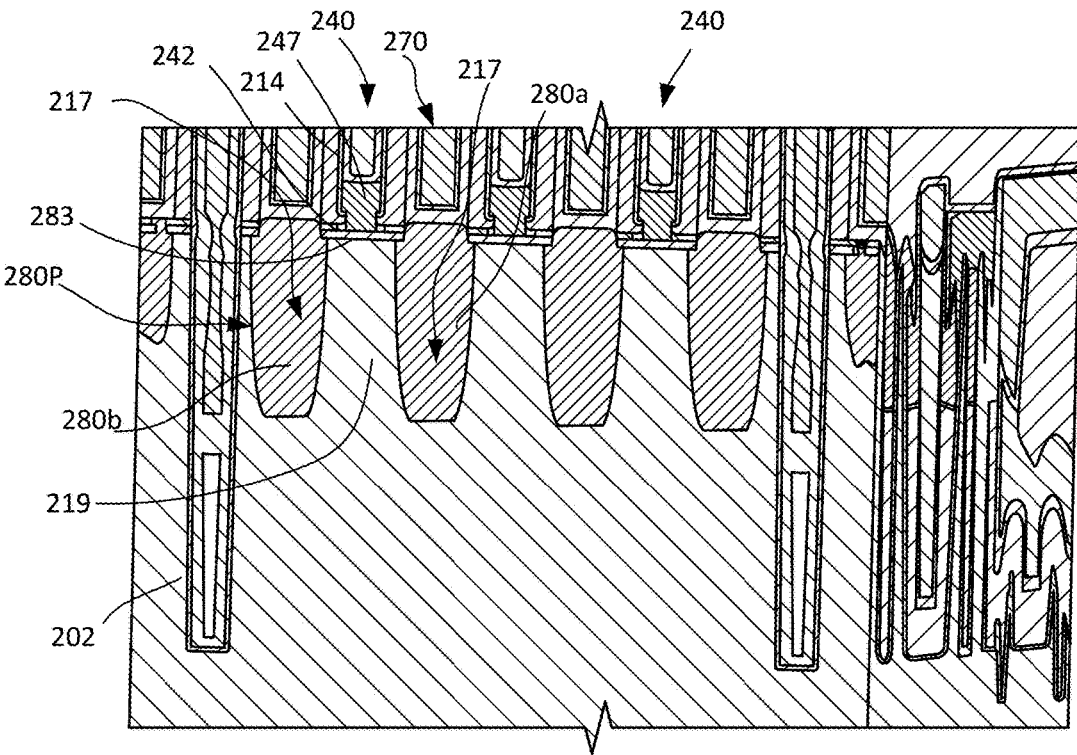

Referring to FIGS. 2E and 2F, where FIG. 2E is a cross section similar to those in FIG. 2C in that it is in the x direction, and where FIG. 2F is a cross section of the structure of FIG. 2E in the y direction, a structure is shown corresponding to implementation of operations 166 and 168 of FIG. 1.

At operation 166, interlayer dielectric (ILD) structures 270 may be provided between the gate lines 240. In an embodiment, as used throughout the present description, material of ILD structures 270 includes a layer of a dielectric or insulating material. Examples of suitable dielectric materials include, but are not limited to, oxides of silicon (e.g., silicon dioxide (SiO.sub.2)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

At operation 168, a plurality of active gate lines 240 is formed over semiconductor fins. The active gate lines 240 include individual gate structures 241. Individual ones of the gate structures 241 include a gate dielectric structure 242 (e.g. a high-k dielectric structure), a fill gate electrode portion 247 (e.g. metal gate). Dielectric spacers 214 provide sidewalls of the active gate lines 240. The provision of gate lines 240 may include the provision of additional spacer 214' adjacent spacer 214 as shown.

Gate dielectric, in some embodiments, includes one or more dielectrics, such as one or more oxides (e.g., silicon dioxide), nitrides (e.g., silicon nitride), high-k dielectrics, low-k dielectrics, and/or any other suitable material as can be understood based on this disclosure. Examples of high-k dielectrics include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Examples of low-k dielectrics include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbomenes, polyimide), spin-on silicon based polymeric dielectrics (e.g., hydrogen silsesquioxane, methylsilsesquioxane), to provide some examples. In some embodiments, an annealing process is carried out on the gate dielectric to improve its quality when, for example, high-k dielectric material is employed.

In some embodiments, the gate dielectric includes oxygen. In some such embodiments where the gate dielectric includes oxygen, the gate dielectric also includes one or more other materials, such as one or more of hafnium, silicon, lanthanum, aluminum, zirconium, tantalum, titanium, barium, strontium, yttrium, lead, scandium, zinc, lithium, or niobium. For instance, the gate dielectric may include hafnium and oxygen (e.g., in the form of hafnium oxide or hafnium silicon oxide), or the gate dielectric may include silicon and oxygen (e.g., in the form of silicon dioxide, hafnium silicon oxide, or zirconium silicon oxide), in accordance with some embodiments. In some embodiments, the gate dielectric includes nitrogen. In some such embodiments where the gate dielectric includes nitrogen, the gate dielectric may also include one or more other materials, such as silicon (e.g., silicon nitride) for instance. In some embodiments, the gate dielectric includes silicon and oxygen, such as in the form of one or more silicates (e.g., titanium silicate, tungsten silicate, niobium silicate, and silicates of other transition metals). In some embodiments, the gate dielectric includes oxygen and nitrogen (e.g., silicon oxynitride or aluminum oxynitride).

Gate electrode, in some embodiments, includes one or more metals, such as one or more of aluminum, tungsten, titanium, tantalum, copper, nickel, gold, platinum, ruthenium, or cobalt, for example. In some embodiments, the gate electrode includes carbon and/or nitrogen, such as in combination with one or more of the metals in the preceding sentence, for example. For instance, in some embodiments gate electrode includes titanium and nitrogen (e.g., titanium nitride), or tantalum and nitrogen (e.g., tantalum nitride), such as in a cap layer that is in direct contact with the gate dielectric, for example. Thus, in some embodiments, the gate electrode includes one or more metals that may or may not include one or more other materials (such as carbon and/or nitrogen). In some embodiments, the gate electrode includes a multilayer structure, including two or more compositionally distinct layers. For instance, in some such embodiments, one or more work function layers are employed, such as one or more metal-including layers that are formed with desired electrical characteristics. Further, in some such embodiments, the one or more metal-including layers include tantalum and/or titanium, which may also include nitrogen (e.g., in the form of tantalum nitride or titanium nitride).

In some embodiments, the gate electrode includes a resistance reducing metal layer between a bulk metal structure and the gate dielectric, for instance. Example resistance reducing metals include, for instance one or more of nickel, titanium, titanium with nitrogen (e.g., titanium nitride), tantalum, tantalum with nitrogen (e.g., tantalum nitride), cobalt, gold, gold with germanium (e.g., gold-germanium), nickel, platinum, nickel with platinum (e.g., nickel-platinum), aluminum, and/or nickel with aluminum (e.g., nickel aluminum), for instance. Example bulk metal structures include one or more of aluminum, tungsten, ruthenium, copper, or cobalt, for instance. In some embodiments, the gate electrode includes additional layers, such as one or more layers including titanium and nitrogen (e.g., titanium nitride) and/or tantalum and nitrogen (e.g., tantalum nitride), which can be used for adhesion and/or cap/barrier purposes, for example. In some embodiments, the thickness, material, and/or deposition process of sub-layers within a multilayer gate electrode are selected based on a target application, such as whether the gate electrode is to be used with an n-channel device or a p-channel device. In some embodiments, the gate electrode provides means for changing the electrical attributes of each adjacent channel layer 206 when a voltage is applied to the gate electrode.

Figure 2G:
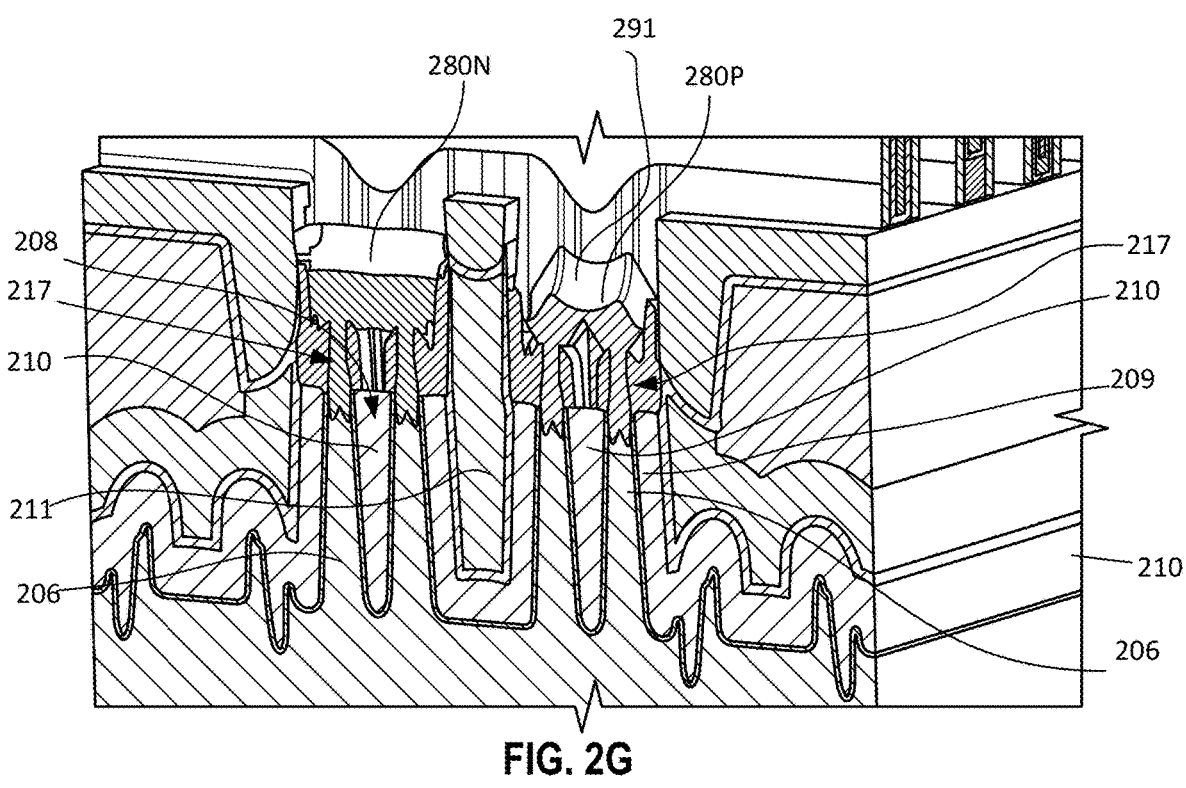
Figure 2H:
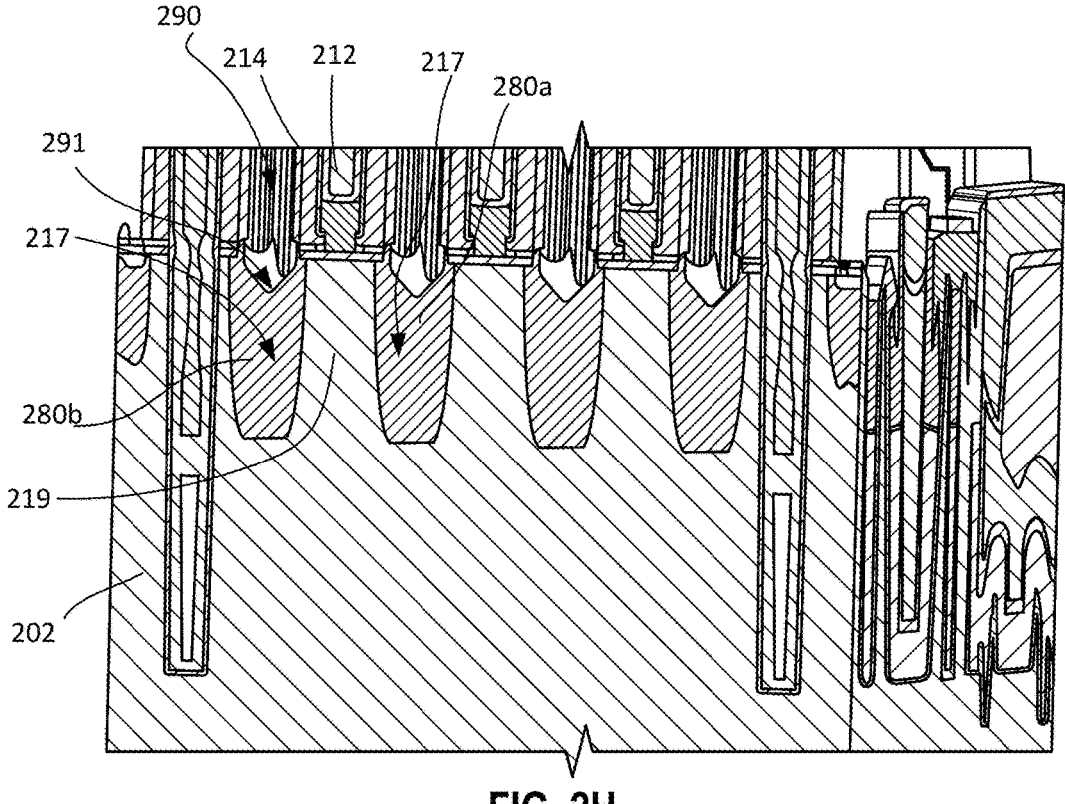

Referring now to FIGS. 2G and 2H, where FIG. 2G is a cross section similar to those in FIG. 2E in that it is in the x direction, and where FIG. 2H is a cross section of the structure of FIG. 2G in the y direction, a structure is shown corresponding to implementation of operation 170 of flowchart 100 of FIG. 1.

At operation 170, source/drain contact trenches 290 are formed in dielectric or ILD layer 270, for example via etch processing in which the source/drain contact structures can be formed. In some such embodiments, dielectric or ILD layer 270 is completely removed between gate spacers 214. However, in other embodiments, a portion of dielectric layer 270 may remain between the gate spacers 214. In some such embodiments, the contact trenches 290 may be formed using any suitable technique, such as performing one or more wet and/or dry etch processes to remove portions of ILD layer 270 as shown, and/or any other suitable processing as will be apparent in light of this disclosure. Such etch processing may be referred to as the source/drain contact trench etch processing, or simply, contact trench etch processing. Further, in some such embodiments, the ILD may first be patterned such that areas that are not to be removed via the contact trench etch processing are masked off, for example. In some embodiments, for example as shown in FIGS. 2G and 2H, in addition to removal of the ILD material, removal of a portion of a top region of the source/drain structures 280P may be effected as part of providing the contact trenches 290, which may then extend into concave recesses 291 on the top surfaces of the source/drain structures 280P of the PMOS transistor devices, such as PMOS transistor device 263 of IC structure 200 of FIGS. 2K and 2L, for example below a lower surface 283 of the corresponding gate structures 241. In some embodiments, the contact trenches 290 are not etched down as shown in FIGS. 2G and 2H.

Figure 2I:
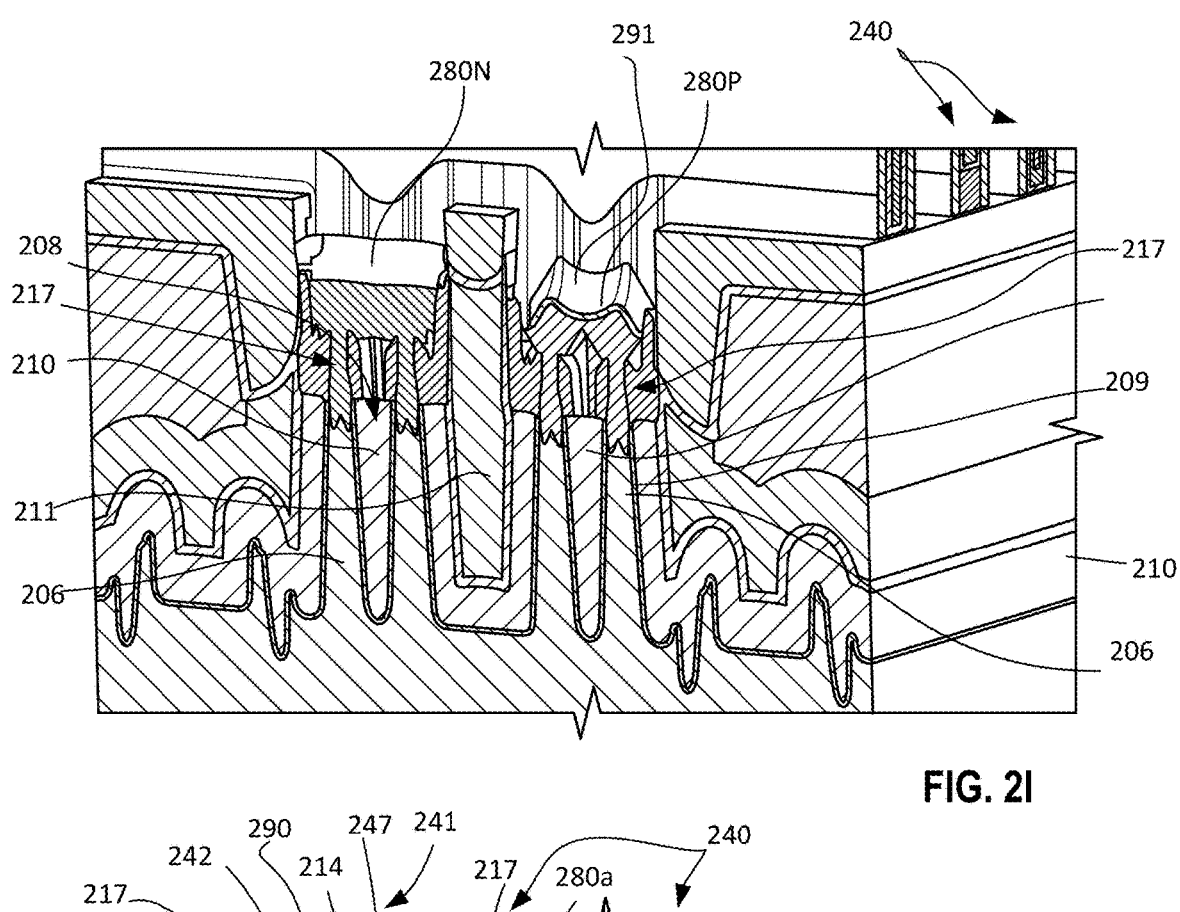
Figure 2J:
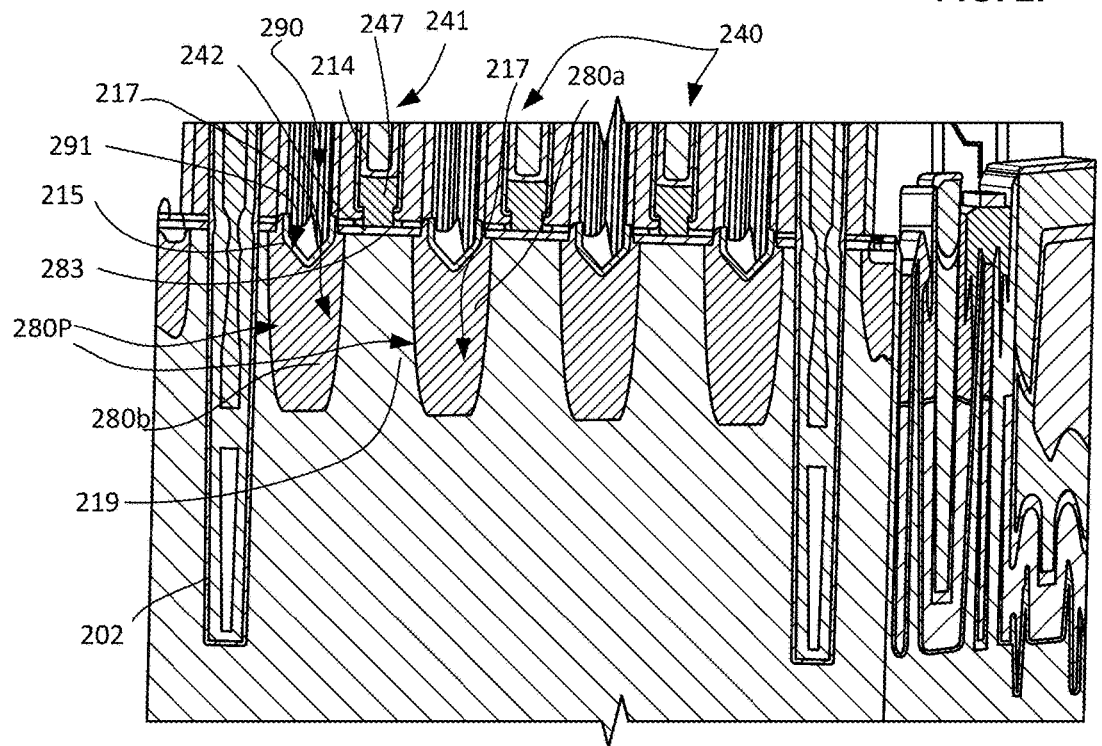
Figures 2K, 2L:
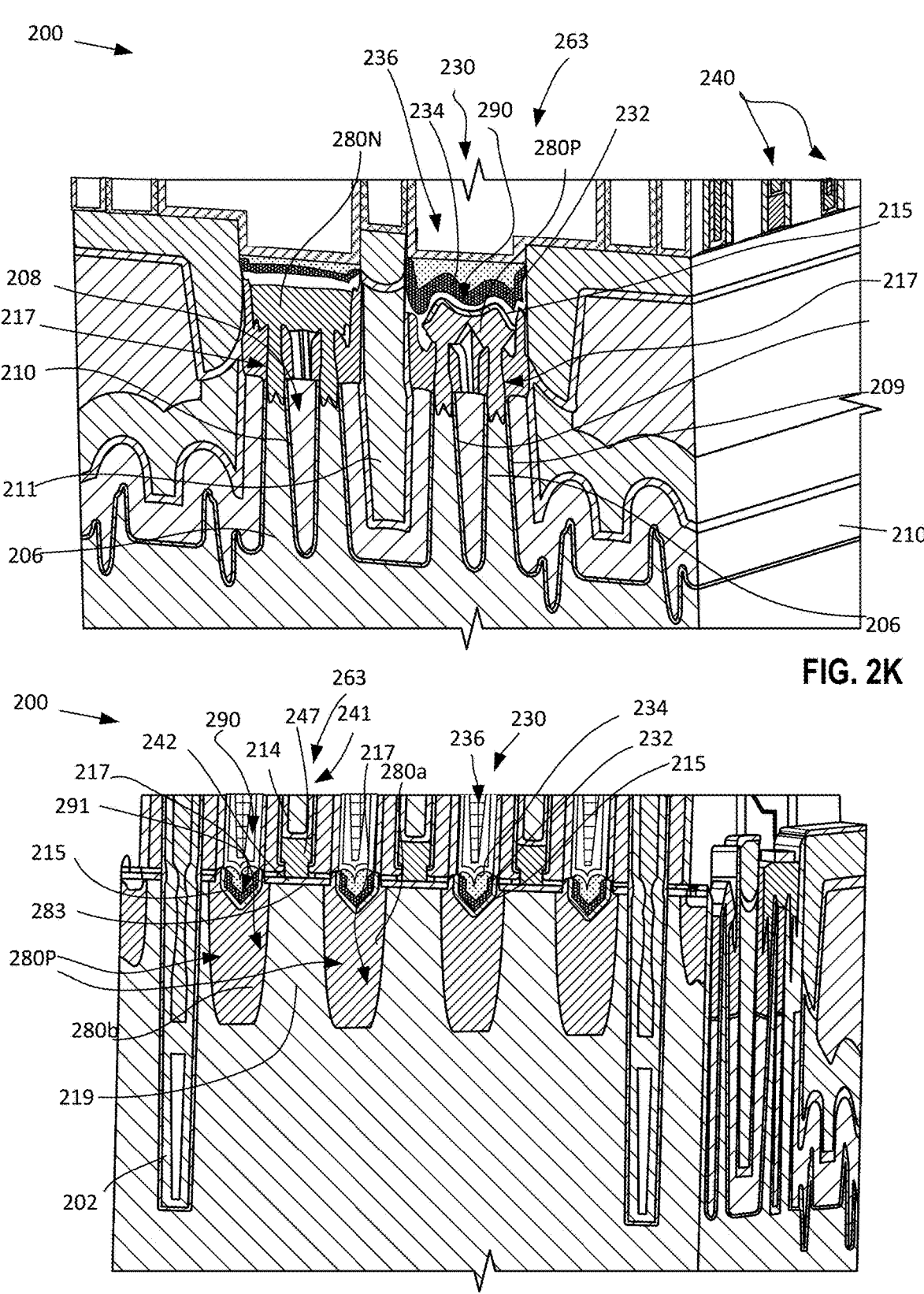

Referring now to FIGS. 2I and 2J, where FIG. 2I is a cross section similar to those in FIG. 2G in that it is in the x direction, and where FIG. 2J is a cross section of the structure of FIG. 2G in the y direction, a structure is shown corresponding to implementation of operation 172, 174 and 176 of flowchart 100 of FIG. 1.

At operation 172, an intrinsic group IV material may be deposited onto the source/drain regions 280P. In one example the group IV material includes Ge. In one example, the Ge is deposited so as to be selective to the NMOS source/drain regions 280N, and therefore such that the Ge deposits only on the PMOS source/drain regions 280P. An epitaxial growth and/or selective deposition process (e.g., using CVD, molecular beam epitaxy (MBE), sputtering, atomic layer deposition (ALD), or metal organic chemical vapor deposition (MOCVD)) may then be employed to form capping layers 215. The epitaxial growth or deposition process may, for example, selectively form Ge or other group IV material onto the group IV source/drain structures 280P. Where the source/drain structures 280P include a group III-V material, the material deposited for the capping layer may include a group III.V material. According to an example, the Ge or other group IV material may be selectively deposited as an intrinsic material, which may then be subject to p-type ion implantation or doping according to operations 174 and 176. Preferably, the Ge material is deposited using CVD, using a mixture of precursors that include Ge, hydrogen and optionally HCl. The selective Ge deposition may be performed, for example using a conventional CVD tool, with a temperature in the range of about 300 to about 400 degrees Celsius, a pressure of about 200-400 Torr, and GeH4 provided as one of the precursors.

At operation 174, optionally, an ion implantation mask may be provided onto the source/drain structures 280 in order to enable ion implantation patterning with doping to occur only on the PMOS source/drains 280P.

At operation 176, ion implantation or doping of the source/drain structures 280P may be performed with a p-type dopant, such as boron, or other p-type dopants, such as aluminum, gallium and/or indium. If an implantation mask is not used at operation 174, some p-type dopants may be implanted onto the source/drain structures 280N of the NMOS transistor devices. However, the NMOS contact resistance is minimally degraded or not degraded due to the excessive number of n-dopants compared to the small number of p-type dopants. If Ge is the group IV material selectively deposited on the source/drain regions 280P, it may be doped to include a boron isotope content with an atomic percentage of boron 11 of at least about 95%.

Referring now to FIGS. 2K and 2L, where FIG. 2K is a cross section similar to those in FIG. 2I in that it is in the x direction, and where FIG. 2L is a cross section of the structure of FIG. 2J in the y direction, a structure is shown corresponding to implementation of operation 178 of flowchart 100 of FIG. 1, and results, after backend processing, into an IC structure 200.

At operation 178, source/drain contact material deposition and patterning is performed to form conductive contact structures 230. It is to be appreciated that, following with operation 176 of flowchart 100 of FIG. 1, contacts and back end processing may then be performed. In FIG. 2K, the contact metal, in the shown example, is extending into the contact trenches 290 below the lower surface 283 of the gate dielectric 242.

Source/drain contact structures 230, in some embodiments, include one or more metals. For instance, one or both of source/drain contact structures may include a metal, such as a resistance reducing metal and a contact plug metal, or just a contact plug, for instance. Example contact resistance reducing metals include, for instance, nickel, titanium, titanium with nitrogen (e.g., in the form of titanium nitride), tantalum, tantalum with nitrogen (e.g., in the form of tantalum nitride), cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive material could be employed. In some embodiments, additional contact material layers are present in the source/drain contact trenches, for example, titanium, titanium with nitrogen (e.g., in the form of titanium nitride), tantalum, and/or tantalum with nitrogen (e.g., in the form of tantalum nitride).

In the shown embodiment of FIG. 2K, the contact structures 230 include a contact metal, a titanium liner 232 adjacent the capping layer 215, and a titanium nitride layer 234 adjacent to and conformal with the titanium liner 232. Additional contact structure materials, such as liners 236, for example including one or more of a silicide/Ti/TiN/W/Co may be provided, along with a contact body 238 including a conductive metal/

Contact materials may be deposited using one or more of chemical vapor deposition (CVD), plasma enhanced chemical vapor deposition (PECVD), atomic layer deposition (ALD), conductive contact fabrication, or thin films. Particular embodiments may include the fabrication of a titanium or like metallic layer using a low temperature (e.g., less than 500 degrees Celsius, or in the range of 400-500 degrees Celsius) chemical vapor deposition of a contact metal to provide a conformal source or drain contact. Implementation of such a conformal source or drain contact may improve three-dimensional (3D) transistor complementary metal oxide semiconductor (CMOS) performance. Metal to semiconductor contact layers may also be deposited using sputtering.

The provision of capping layers 215 as shown in FIGS. 2K and 2L reduces the Schottky barrier between the source/drain structures 280P and the contact structures 230. The resulting configuration may reduce the resistance of the junction. Embodiments may include deposition of an epitaxial capping layer including boron doped Ge where the capping layer has a non-flat topography. Conformal deposition of the contact structures onto a non-flat capping layer may be used to increase the available area of metal semiconductor contact and reduce resistance, improving the performance of the transistor device.

Referring back to FIGS. 2K and 2L, some embodiments include an integrated circuit (IC) structure 200 including: a substrate (e.g. 202); a transistor device (e.g. 263) on the substrate, the transistor device comprising: a channel structure (e.g. provided by fins 206) including a semiconductor material; a gate structure (e.g. 213) including a metal, the gate structure on the channel structure; a source structure (e.g. 280a) in a first trench at a first side of the gate structure; a drain structure (e.g. 280b) in a second trench at a second side of the gate structure; and a capping layer (e.g. 215) on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and metal contact structures 230 coupled to respective ones of the source structure and of the drain structure.

It is to be appreciated that a variety of integrated circuit structures may be fabricated using an integration scheme involving a metallic layer deposition process as described herein. In accordance with an embodiment of the present disclosure, a method of fabricating an integrated circuit structure includes providing a substrate in a chemical vapor deposition (CVD) chamber having an RF source, the substrate having a feature thereon. The method also includes reacting titanium tetrachloride (TiCl.sub.4) and hydrogen (H.sub.2) to form a titanium (Ti) layer on the feature of the substrate. In an embodiment, the titanium layer has a total atomic composition including 98% or greater of titanium and 0.5-2% of chlorine. In alternative embodiments, a similar process is used to fabricate a high purity metallic layer of zirconium (Zr), hafnium (Hf), tantalum (Ta), niobium (Nb), or vanadium (V).

In accordance with an embodiment of the present disclosure, the feature of the substrate is a source or drain contact trench exposing a semiconductor source or drain structure. The titanium layer (or other high purity metallic layer) is a conductive contact layer for the semiconductor source or drain structure.

According to some embodiments, capping layers 215 may include opening up the source/drain regions by removing the ILD structure 270 to expose top surfaces of the source/drain structures for contact formation. The above is followed by the provision of a capping layer by deposition of an intrinsic a group IV material by way of example, and by p-type ion implantation into the group IV material such that one isotope of the p-type dopant represents at least 95% of p-type isotopes in the capping layer.

Thereafter, typical contact layers (Ti, TiN, and contact metal) are deposited into the source drain volume, optionally, with most of the volume being filled with the contact metal.

The presence of the source/drain caps according to some embodiments may be visible in a transmission electron microscopy (TEM) of the source/drain region. In a TEM, some embodiments may exhibit a capping layer on source/drain structures of a semiconductor device, such as a PMOS device, where a boron isotope content of the material of the capping layer includes boron 11 at an atomic percentage of at least about 95%. The above is distinguishable from a typical FIN-FET structure that may include boron 11 at less than 95%, or that may include boron 10 at more than 5%.

Embodiments may advantageously be used for both PMOS devices as well as on CMOS devices. Embodiments may also advantageously be used with a variety of channel materials including: strained and unstrained Si, strained and unstrained SiGe, Ge, Sn containing channels, and III-V channels. Embodiments are further applicable to gate first or gate last process flows.

Additionally, embodiments may advantageously be used on a variety of architectures including: planar transistors, FinFETS, TFETs, stacked CMOS, gate-all-around transistors and architectures where the backend contacts are made from the backside for the wafer though a via.

FIG. 3 is a flow chart of a process 300 according to one embodiment. At operation 302, process 300 includes providing, on a substrate, an epitaxial layer including a semiconductor material. At operation 302, process 300 includes etching the epitaxial layer to form a channel structure therefrom, etching including providing a first trench at a first side of the channel structure, and a second trench at a second side of the channel structure. At operation 304, process 300 includes providing a first trench on a first side of a gate region on the channel structure, and a second trench on a second side of the gate region. At operation 306, process 300 includes providing a source structure in the first trench, and a drain structure in the second trench. At operation 308, process 300 includes providing a gate structure at the gate region. At operation 310 process 300 includes providing a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer. At operation 312, process 300 includes providing metal contact structures coupled to corresponding ones of the source structure and of the drain structure.

Figure 4:
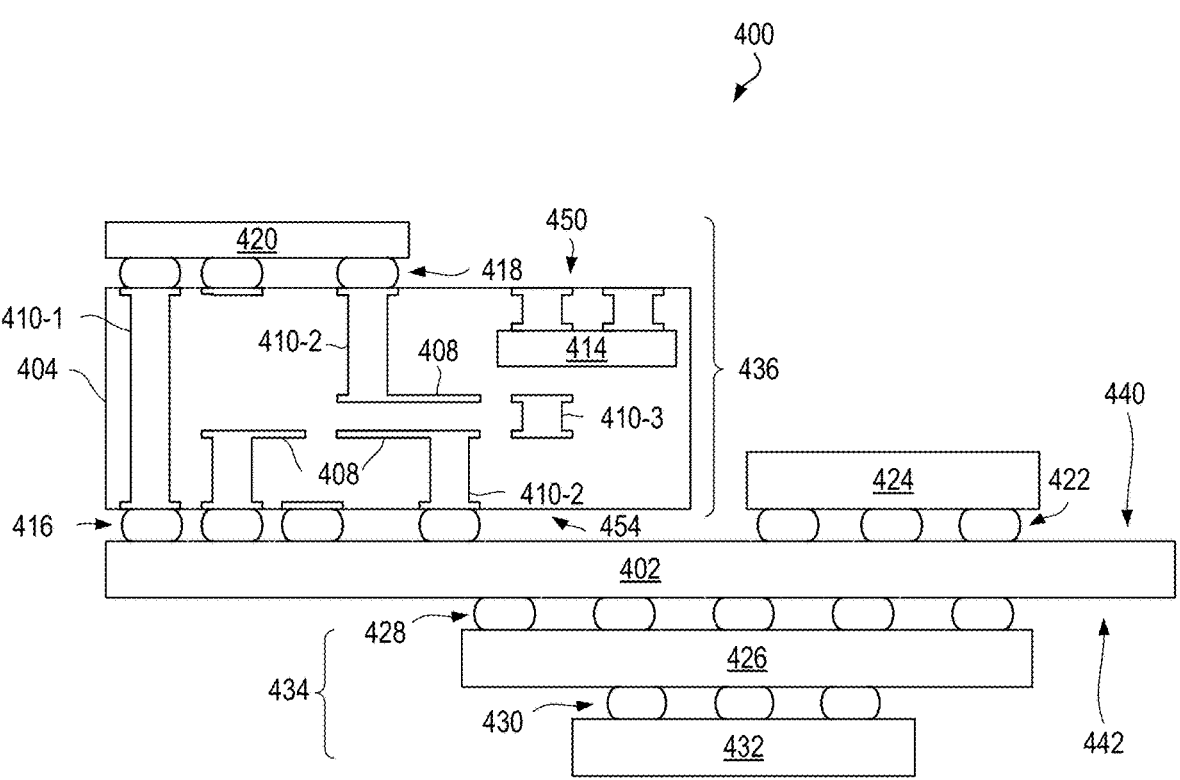
FIG. 4 is a cross-sectional side view of an integrated circuit device assembly that may include a transistor device in accordance with any of the embodiments disclosed herein.

FIG. 4 is a cross-sectional side view of an integrated circuit device assembly 400 that may include one or more integrated circuit structures each including any of the transistor devices described herein. The integrated circuit device assembly 400 includes a number of components disposed on a circuit board 402 (which may be a motherboard, system board, mainboard, etc.). The integrated circuit device assembly 400 includes components disposed on a first face 440 of the circuit board 402 and an opposing second face 442 of the circuit board 402; generally, components may be disposed on one or both faces 440 and 442. Any of the integrated circuit components discussed below with reference to the integrated circuit device assembly 400 may include an integrated circuit structure including transistor device embodiments as disclosed herein.

In some embodiments, the circuit board 402 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 402. In other embodiments, the circuit board 402 may be a non-PCB substrate. The integrated circuit device assembly 400 illustrated in FIG. 4 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 4), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 436 may include an integrated circuit component 420 coupled to an interposer 404 by coupling components 418. The coupling components 418 may take any suitable form for the application, such as the forms discussed above with reference to the coupling components 416. Although a single integrated circuit component 420 is shown in FIG. 4, multiple integrated circuit components may be coupled to the interposer 404; indeed, additional interposers may be coupled to the interposer 404. The interposer 404 may provide an intervening substrate used to bridge the circuit board 402 and the integrated circuit component 420.

The integrated circuit component 420 may be a packaged or unpackaged integrated circuit product that includes one or more integrated circuit dies including transistor devices such as those shown in FIGS. 9B and 9C. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 420, a single monolithic integrated circuit die comprises solder bumps attached to contacts on the die. The solder bumps allow the die to be directly attached to the interposer 404. The integrated circuit component 420 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 420 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 420 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 420 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 404 may spread connections to a wider pitch or reroute a connection to a different connection. For example, the interposer 404 may couple the integrated circuit component 420 to a set of ball grid array (BGA) conductive contacts of the coupling components 416 for coupling to the circuit board 402. In the embodiment illustrated in FIG. 4, the integrated circuit component 420 and the circuit board 402 are attached to opposing sides of the interposer 404; in other embodiments, the integrated circuit component 420 and the circuit board 402 may be attached to a same side of the interposer 404. In some embodiments, three or more components may be interconnected by way of the interposer 404.

In some embodiments, the interposer 404 may be formed as a PCB, including multiple metal layers separated from one another by layers of dielectric material and interconnected by electrically conductive vias. In some embodiments, the interposer 404 may be formed of an epoxy resin, a fiberglass-reinforced epoxy resin, an epoxy resin with inorganic fillers, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through hole vias 410-1 (that extend from a first face 450 of the interposer 404 to a second face 454 of the interposer 404), blind vias 410-2 (that extend from the first or second faces 450 or 454 of the interposer 404 to an internal metal layer), and buried vias 410-3 (that connect internal metal layers).

In some embodiments, the interposer 404 can comprise a silicon interposer. Through silicon vias (TSV) extending through the silicon interposer can connect connections on a first face of a silicon interposer to an opposing second face of the silicon interposer. In some embodiments, an interposer 404 comprising a silicon interposer can further comprise one or more routing layers to route connections on a first face of the interposer 404 to an opposing second face of the interposer 404.

The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art. In embodiments where the interposer is a non-printed circuit board The integrated circuit device assembly 400 may include an integrated circuit component 424 coupled to the first face 440 of the circuit board 402 by coupling components 422. The coupling components 422 may take the form of any of the embodiments discussed above with reference to the coupling components 416, and the integrated circuit component 424 may take the form of any of the embodiments discussed above with reference to the integrated circuit component 420.

The integrated circuit device assembly 400 illustrated in FIG. 4 includes a package-on-package structure 434 coupled to the second face 442 of the circuit board 402 by coupling components 428. The package-on-package structure 434 may include an integrated circuit component 426 and an integrated circuit component 432 coupled together by coupling components 430 such that the integrated circuit component 426 is disposed between the circuit board 402 and the integrated circuit component 432. The coupling components 428 and 430 may take the form of any of the embodiments of the coupling components 416 discussed above, and the integrated circuit components 426 and 432 may take the form of any of the embodiments of the integrated circuit component 420 discussed above. The package-on-package structure 434 may be configured in accordance with any of the package-on-package structures known in the art.

Figure 5:
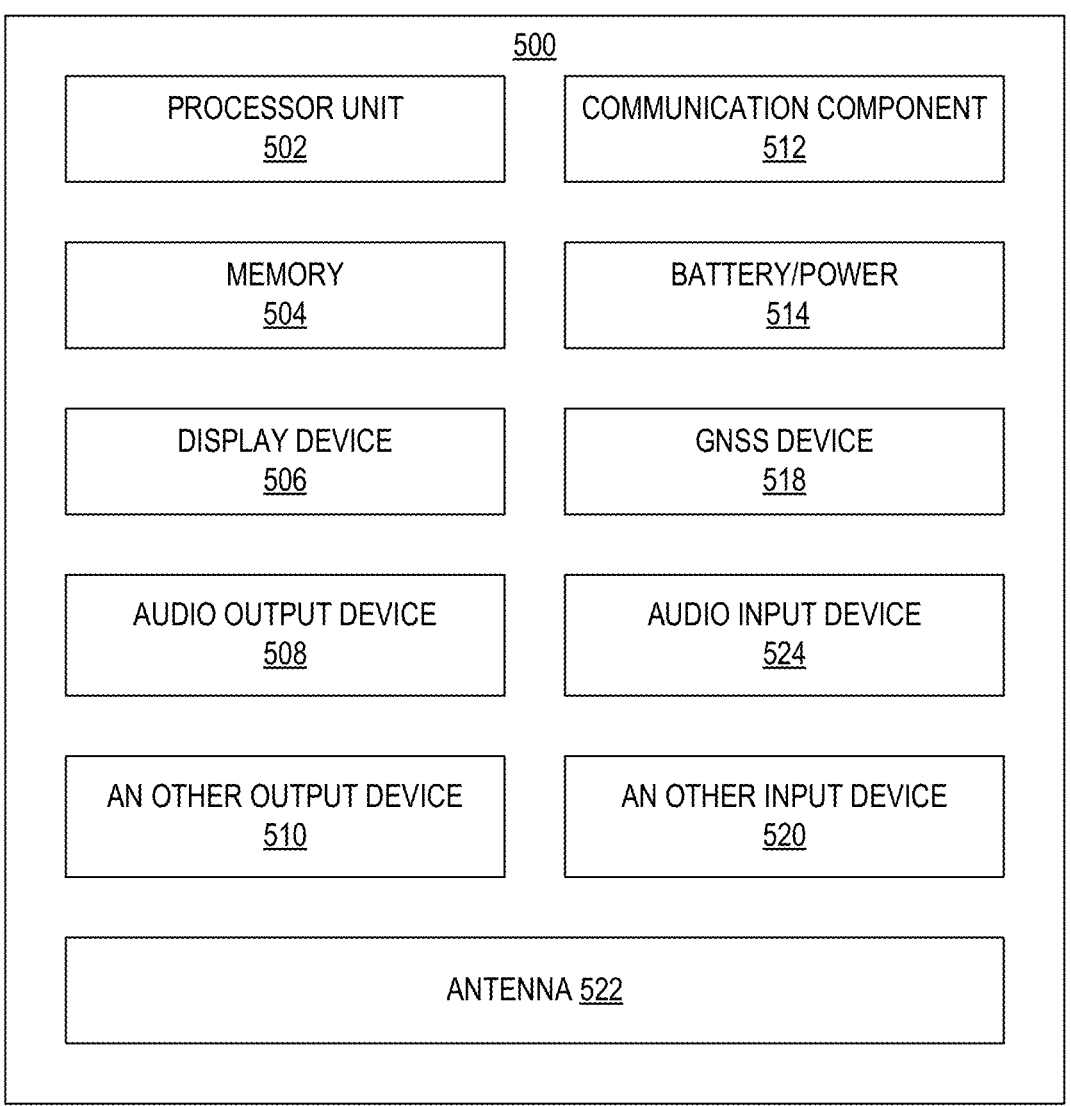
FIG. 5 is a block diagram of an example electrical device that may include a transistor device, in accordance with any of the embodiments disclosed herein.

FIG. 5 is a block diagram of an example electrical device 500 that may include one or more of the transistor devices of embodiments disclosed herein. For example, any suitable ones of the components of the electrical device 500 may include one or more of the integrated circuit device assemblies 400, integrated circuit components 420, and/or transistor device embodiments disclosed herein. A number of components are illustrated in FIG. 5 as included in the electrical device 500, but any one or more of these components may be omitted or duplicated, as suitable for the application. In some embodiments, some or all of the components included in the electrical device 500 may be attached to one or more motherboards mainboards, or system boards. In some embodiments, one or more of these components are fabricated onto a single system-on-a-chip (SoC) die.

Additionally, in various embodiments, the electrical device 500 may not include one or more of the components illustrated in FIG. 5, but the electrical device 500 may include interface circuitry for coupling to the one or more components. For example, the electrical device 500 may not include a display device 506, but may include display device interface circuitry (e.g., a connector and driver circuitry) to which a display device 506 may be coupled. In another set of examples, the electrical device 500 may not include an audio input device 524 or an audio output device 508, but may include audio input or output device interface circuitry (e.g., connectors and supporting circuitry) to which an audio input device 524 or audio output device 508 may be coupled.

The electrical device 500 may include one or more processor units 502 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 502 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 500 may include a memory 504, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 504 may include memory that is located on the same integrated circuit die as the processor unit 502. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 500 can comprise one or more processor units 502 that are heterogeneous or asymmetric to another processor unit 502 in the electrical device 500. There can be a variety of differences between the processing units 502 in a system in terms of a spectrum of metrics of merit including architectural, microarchitectural, thermal, power consumption characteristics, and the like. These differences can effectively manifest themselves as asymmetry and heterogeneity among the processor units 502 in the electrical device 500.

In some embodiments, the electrical device 500 may include a communication component 512 (e.g., one or more communication components). For example, the communication component 512 can manage wireless communications for the transfer of data to and from the electrical device 500. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 512 may operate in accordance with other wireless protocols in other embodiments. The electrical device 500 may include one or more antennas, such as antenna 522 to facilitate wireless communications and/or to receive other wireless communications (such as AM or FM radio transmissions).

In some embodiments, the communication component 512 may manage wired communications, such as electrical, optical, or any other suitable communication protocols (e.g., IEEE 802.3 Ethernet standards). As noted above, the communication component 512 may include multiple communication components. For instance, a first communication component 512 may be dedicated to shorter-range wireless communications such as Wi-Fi or Bluetooth, and a second communication component 512 may be dedicated to longer-range wireless communications such as global positioning system (GPS), EDGE, GPRS, CDMA, WiMAX, LTE, EV-DO, or others. In some embodiments, a first communication component 512 may be dedicated to wireless communications, and a second communication component 512 may be dedicated to wired communications.

The electrical device 500 may include battery/power circuitry 514. The battery/power circuitry 514 may include one or more energy storage devices (e.g., batteries or capacitors) and/or circuitry for coupling components of the electrical device 500 to an energy source separate from the electrical device 500 (e.g., AC line power).

The electrical device 500 may include a display device 506 (or corresponding interface circuitry, as discussed above). The display device 506 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 500 may include an audio output device 508 (or corresponding interface circuitry, as discussed above). The audio output device 508 may include any embedded or wired or wirelessly connected external device that generates an audible indicator, such speakers, headsets, or earbuds.

The electrical device 500 may include an audio input device 524 (or corresponding interface circuitry, as discussed above). The audio input device 524 may include any embedded or wired or wirelessly connected device that generates a signal representative of a sound, such as microphones, microphone arrays, or digital instruments (e.g., instruments having a musical instrument digital interface (MIDI) output). The electrical device 500 may include a Global Navigation Satellite System (GNSS) device 518 (or corresponding interface circuitry, as discussed above), such as a Global Positioning System (GPS) device. The GNSS device 518 may be in communication with a satellite-based system and may determine a geolocation of the electrical device 500 based on information received from one or more GNSS satellites, as known in the art.

The electrical device 500 may include another output device 510 (or corresponding interface circuitry, as discussed above). Examples of the other output device 510 may include an audio codec, a video codec, a printer, a wired or wireless transmitter for providing information to other devices, or an additional storage device.

The electrical device 500 may include another input device 520 (or corresponding interface circuitry, as discussed above). Examples of the other input device 520 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 500 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 500 may be any other electronic device that processes data. In some embodiments, the electrical device 500 may comprise multiple discrete physical components. Given the range of devices that the electrical device 500 can be manifested as in various embodiments, in some embodiments, the electrical device 500 can be referred to as a computing device or a computing system.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" or "A is on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term "directly coupled" means that two or more elements are in direct contact.

As used herein, the term "module" refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, "electrically conductive" in some examples may refer to a property of a material having an electrical conductivity greater than or equal to $10^7$ Siemens per meter (S/m) at 20 degrees Celsius. Examples of such materials include Cu, Ag, Al, Au, W, Zn and Ni.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc., as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the elements that are connected, without any intermediary devices. The term "coupled" means a direct or indirect connection, such as a direct electrical, mechanical, or magnetic connection between the elements that are connected or an indirect connection, through one or more passive or active intermediary devices. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

EXAMPLES

Some non-limiting example embodiments are set forth below.

Example 1 includes an integrated circuit (IC) structure including an integrated circuit (IC) structure including: a substrate; a transistor device on the substrate, the transistor device comprising: a channel structure including a semiconductor material; a gate structure including a metal, the gate structure on the channel structure; a source structure in a first trench at a first side of the gate structure; a drain structure in a second trench at a second side of the gate structure; a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and metal contact structures coupled to respective ones of the source structure and of the drain structure.

Example 2 includes the subject matter of Example 1, wherein the semiconductor material of the capping layer includes a group IV semiconductor material.

Example 3 includes the subject matter of Example 2, wherein the group IV semiconductor material includes germanium.

Example 4 includes the subject matter of Example 2, wherein the group IV semiconductor material includes one or more of silicon, germanium, tin, carbon, indium, gallium, aluminum, arsenic, nitrogen, phosphorous, arsenic, or antimony.

Example 5 includes the subject matter of Example 2, wherein the p-type dopant of the capping layer includes boron, and wherein the isotope of the p-type dopant in the capping layer includes boron 11.

Example 6 includes the subject matter of Example 5, wherein a boron 10 isotope in the capping layer represents an atomic percentage of at most about 5% of a boron isotope content of the capping layer.

Example 7 includes the subject matter of Example 6, wherein boron 10 is present in the material at an atomic concentration that exhibits a gradient across a thickness of the cap.

Example 8 includes the subject matter of Example 7, wherein the atomic concentration of boron 10 decreases in a direction from a bottom surface of the capping layer closest to the corresponding one of the source structure or of the drain structure and toward a top surface of the capping layer.

Example 9 includes the subject matter of Example 1, wherein the capping layer is disposed at least partially in a corresponding one of the first trench or of the second trench, and wherein individual ones of the metal contact structures extend into said corresponding one of the first trench or of the second trench and are in contact with a top surface of the capping layer.

Example 10 includes the subject matter of Example 9, wherein a top surface of the capping layer defines a concavity facing toward the contact structures.

Example 11 includes the subject matter of Example 1, wherein individual ones of metal contact structures include a layer including titanium adjacent the capping layer, and a layer including titanium nitride on the layer including titanium.

Example 12 includes an integrated circuit (IC) device comprising: a substrate; and an array of transistor devices on the substrate, individual ones of at least some of the transistor devices of the array including: a substrate; and a transistor device on the substrate, the transistor device comprising: a channel structure including a semiconductor material; a gate structure including a metal, the gate structure on the channel structure; a source structure in a first trench at a first side of the gate structure; a drain structure in a second trench at a second side of the gate structure; a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and metal contact structures coupled to respective ones of the source structure and of the drain structure.

Example 13 includes the subject matter of Example 12, wherein the semiconductor material of the capping layer includes a group IV semiconductor material.

Example 14 includes the subject matter of Example 13, wherein the group IV semiconductor material includes germanium.

Example 15 includes the subject matter of Example 13, wherein the group IV semiconductor material includes one or more of silicon, germanium, tin, carbon, indium, gallium, aluminum, arsenic, nitrogen, phosphorous, arsenic, or antimony.

Example 16 includes the subject matter of Example 13, wherein the p-type dopant of the capping layer includes boron, and wherein the isotope of the p-type dopant in the capping layer includes boron 11.

Example 17 includes the subject matter of Example 16, wherein a boron 10 isotope in the capping layer represents an atomic percentage of at most about 5% of a boron isotope content of the capping layer.

Example 18 includes the subject matter of Example 17, wherein boron 10 is present in the material at an atomic concentration that exhibits a gradient across a thickness of the cap.

Example 19 includes the subject matter of Example 18, wherein the atomic concentration of boron 10 decreases in a direction from a bottom surface of the capping layer closest to the corresponding one of the source structure or of the drain structure and toward a top surface of the capping layer.

Example 20 includes the subject matter of Example 12, wherein the capping layer is disposed at least partially in a corresponding one of the first trench or of the second trench, and wherein individual ones of the metal contact structures extend into said corresponding one of the first trench or of the second trench and are in contact with a top surface of the capping layer.

Example 21 includes the subject matter of Example 20, wherein a top surface of the capping layer defines a concavity facing toward the contact structures.

Example 22 includes the subject matter of Example 12, wherein individual ones of metal contact structures include a layer including titanium adjacent the capping layer, and a layer including titanium nitride on the layer including titanium.

Example 23 includes an integrated circuit (IC) device assembly including: a printed circuit board; and a plurality of integrated circuit components attached to the printed circuit board, individual ones of the integrated circuit components including one or more integrated circuit dies, individual ones of the dies including a plurality of transistor devices, wherein individual ones of the plurality of transistor devices include: a substrate; and a transistor device on the substrate, the transistor device comprising: a channel structure including a semiconductor material; a gate structure including a metal, the gate structure on the channel structure; a source structure in a first trench at a first side of the gate structure; a drain structure in a second trench at a second side of the gate structure; a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and metal contact structures coupled to respective ones of the source structure and of the drain structure.

Example 24 includes the subject matter of Example 23, wherein the semiconductor material of the capping layer includes a group IV semiconductor material.

Example 25 includes the subject matter of Example 24, wherein the group IV semiconductor material includes germanium.

Example 26 includes the subject matter of Example 24, wherein the group IV semiconductor material includes one or more of silicon, germanium, tin, carbon, indium, gallium, aluminum, arsenic, nitrogen, phosphorous, arsenic, or antimony.

Example 27 includes the subject matter of Example 24, wherein the p-type dopant of the capping layer includes boron, and wherein the isotope of the p-type dopant in the capping layer includes boron 11.

Example 28 includes the subject matter of Example 27, wherein a boron 10 isotope in the capping layer represents an atomic percentage of at most about 5% of a boron isotope content of the capping layer.

Example 29 includes the subject matter of Example 28, wherein boron 10 is present in the material at an atomic concentration that exhibits a gradient across a thickness of the cap.

Example 30 includes the subject matter of Example 29, wherein the atomic concentration of boron 10 decreases in a direction from a bottom surface of the capping layer closest to the corresponding one of the source structure or of the drain structure and toward a top surface of the capping layer.

Example 31 includes the subject matter of Example 23, wherein the capping layer is disposed at least partially in a corresponding one of the first trench or of the second trench, and wherein individual ones of the metal contact structures extend into said corresponding one of the first trench or of the second trench and are in contact with a top surface of the capping layer.

Example 32 includes the subject matter of Example 30, wherein a top surface of the capping layer defines a concavity facing toward the contact structures.

Example 33 includes the subject matter of Example 23, wherein individual ones of metal contact structures include a layer including titanium adjacent the capping layer, and a layer including titanium nitride on the layer including titanium.

Example 34 includes a method to fabricate an integrated circuit (IC) structure including: providing, on a substrate, an epitaxial layer including a semiconductor material; etching the epitaxial layer to form a channel structure therefrom, etching including providing a first trench at a first side of the channel structure, and a second trench at a second side of the channel structure; providing a first trench on a first side of a gate region on the channel structure, and a second trench on a second side of the gate region; providing a source structure in the first trench, and a drain structure in the second trench; providing a gate structure at the gate region; and providing a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and providing metal contact structures coupled to corresponding ones of the source structure and of the drain structure.

Example 35 includes the subject matter of Example 34, further including providing, prior to providing the gate structures, an interlayer dielectric material (ILD) on a material of the source structure and on a material of the drain structure, and removing the ILD at least partially to expose a top surface of the source structure and a top surface of the drain structure, providing the capping layer including providing the capping layer on the top surface of the source structure and a top surface of the drain structure after removal of the ILD.

Example 36 includes the subject matter of Example 35, wherein providing the capping layer includes depositing the semiconductor material of the capping layer in an intrinsic form, and doping the semiconductor material with the p-type dopant through ion implantation.

Example 37 includes the subject matter of Example 34, wherein the semiconductor material of the capping layer includes a group IV semiconductor material.

Example 38 includes the subject matter of Example 37, wherein the group IV semiconductor material of the capping layer includes germanium.

Example 39 includes the subject matter of Example 37, wherein the group IV semiconductor material includes one or more of silicon, germanium, tin, carbon, indium, gallium, aluminum, arsenic, nitrogen, phosphorous, arsenic, or antimony.

Example 40 includes the subject matter of Example 37, wherein the p-type dopant of the capping layer includes boron, and wherein the isotope of the p-type dopant in the capping layer includes boron 11.

Example 41 includes the subject matter of Example 40, wherein a boron 10 isotope in the capping layer represents an atomic percentage of at most about 5% of a boron isotope content of the capping layer.

Example 42 includes the subject matter of Example 41, wherein boron 10 is present in the material at an atomic concentration that exhibits a gradient across a thickness of the cap.

Example 43 includes the subject matter of Example 42, wherein the atomic concentration of boron 10 decreases in a direction from a bottom surface of the capping layer closest to the corresponding one of the source structure or of the drain structure and toward a top surface of the capping layer.

Example 44 includes the subject matter of Example 34, wherein the capping layer is disposed at least partially in a corresponding one of the first trench or of the second trench, and wherein individual ones of the metal contact structures extend into said corresponding one of the first trench or of the second trench and are in contact with a top surface of the capping layer.

Example 45 includes the subject matter of Example 44, wherein a top surface of the capping layer defines a concavity facing toward the contact structures.

Example 46 includes the subject matter of Example 23, wherein individual ones of metal contact structures include a layer including titanium adjacent the capping layer, and a layer including titanium nitride on the layer including titanium.

What is claimed is:

1. An integrated circuit (IC) structure including:
a substrate;
a transistor device on the substrate, the transistor device comprising:
    a channel structure including a semiconductor material;
    a gate structure including a metal, the gate structure on the channel structure;
    a source structure in a first trench at a first side of the gate structure;
    a drain structure in a second trench at a second side of the gate structure;
    a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and metal contact structures coupled to respective ones of the source structure and of the drain structure.

2. The IC structure of claim 1, wherein the semiconductor material of the capping layer includes a group IV semiconductor material.

3. The IC structure of claim 2, wherein the group IV semiconductor material includes germanium.

4. The IC structure of claim 2, wherein the group IV semiconductor material includes one or more of silicon, germanium, tin, carbon, indium, gallium, aluminum, arsenic, nitrogen, phosphorous, arsenic, or antimony.

5. The IC structure of claim 2, wherein the p-type dopant of the capping layer includes boron, and wherein the isotope of the p-type dopant in the capping layer includes boron 11.

6. The IC structure of claim 5, wherein a boron 10 isotope in the capping layer represents an atomic percentage of at most about 5% of a boron isotope content of the capping layer.

7. The IC structure of claim 6, wherein boron 10 is present in the material at an atomic concentration that exhibits a gradient across a thickness of the capping layer.

8. The IC structure of claim 7, wherein the atomic concentration of boron 10 decreases in a direction from a bottom surface of the capping layer closest to the corresponding one of the source structure or of the drain structure and toward a top surface of the capping layer.

9. The IC structure of claim 1, wherein the capping layer is disposed at least partially in a corresponding one of the first trench or of the second trench, and wherein individual ones of the metal contact structures extend into said corresponding one of the first trench or of the second trench and are in contact with a top surface of the capping layer.

10. The IC structure of claim 9, wherein a top surface of the capping layer defines a concavity facing toward the contact structures.

11. The IC structure of claim 1, wherein individual ones of metal contact structures include a layer including titanium adjacent the capping layer, and a layer including titanium nitride on the layer including titanium.

12. An integrated circuit (IC) device comprising:
a substrate; and
an array of transistor devices on the substrate, individual ones of at least some of the transistor devices of the array including:
    a substrate; and
    a transistor device on the substrate, the transistor device comprising:
        a channel structure including a semiconductor material;
        a gate structure including a metal, the gate structure on the channel structure;
        a source structure in a first trench at a first side of the gate structure;
        a drain structure in a second trench at a second side of the gate structure;
        a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and
        metal contact structures coupled to respective ones of the source structure and of the drain structure.

13. The IC device of claim 12, wherein the semiconductor material of the capping layer includes a group IV semiconductor material.

14. The IC device of claim 13, wherein the group IV semiconductor material includes germanium.

15. The IC device of claim 13, wherein the p-type dopant of the capping layer includes boron, wherein the isotope of the p-type dopant in the capping layer includes boron 11, wherein a boron 10 isotope in the capping layer represents an atomic percentage of at most about 5% of a boron isotope content of the capping layer.

16. The IC device of claim 15, wherein boron 10 is present in the material at an atomic concentration that exhibits a gradient across a thickness of the capping layer, the atomic concentration of boron 10 decreasing in a direction from a bottom surface of the capping layer closest to the corresponding one of the source structure or of the drain structure and toward a top surface of the capping layer.

17. The IC device of claim 12, wherein the capping layer is disposed at least partially in a corresponding one of the first trench or of the second trench, and wherein individual ones of the metal contact structures extend into said corresponding one of the first trench or of the second trench and are in contact with a top surface of the capping layer.

18. An integrated circuit (IC) device assembly including:
a printed circuit board; and
a plurality of integrated circuit components attached to the printed circuit board, individual ones of the integrated circuit components including one or more integrated circuit dies, individual ones of the dies including a plurality of transistor devices, wherein individual ones of the plurality of transistor devices include:
a substrate; and
a transistor device on the substrate, the transistor device comprising:
a channel structure including a semiconductor material;
a gate structure including a metal, the gate structure on the channel structure;
a source structure in a first trench at a first side of the gate structure;
a drain structure in a second trench at a second side of the gate structure;
a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and
metal contact structures coupled to respective ones of the source structure and of the drain structure.

19. The IC device assembly of claim 18, wherein the semiconductor material of the capping layer includes germanium.

20. The IC device assembly of claim 19, wherein the p-type dopant of the capping layer includes boron, wherein the isotope of the p-type dopant in the capping layer includes boron 11, and wherein a boron 10 isotope in the capping layer represents an atomic percentage of at most about 5% of a boron isotope content of the capping layer.

21. A method to fabricate an integrated circuit (IC) structure including:
providing, on a substrate, an epitaxial layer including a semiconductor material;
etching the epitaxial layer to form a channel structure therefrom, etching including providing a first trench at a first side of the channel structure, and a second trench at a second side of the channel structure;
providing a first trench on a first side of a gate region on the channel structure, and a second trench on a second side of the gate region;
providing a source structure in the first trench, and a drain structure in the second trench;
providing a gate structure at the gate region; and
providing a capping layer on individual ones of the source structure and of the drain structure, the capping layer comprising a semiconductor material of a same group as a semiconductor material of a corresponding one of the source structure or of the drain structure, wherein an isotope of a p-type dopant in the capping layer represents an atomic percentage of at least about 95% of a p-type isotope content of the capping layer; and
providing metal contact structures coupled to corresponding ones of the source structure and of the drain structure.

22. The method of claim 21, further including providing, prior to providing the gate structures, an interlayer dielectric material (ILD) on a material of the source structure and on a material of the drain structure, and removing the ILD at least partially to expose a top surface of the source structure and a top surface of the drain structure, providing the capping layer including providing the capping layer on the top surface of the source structure and a top surface of the drain structure after removal of the ILD.

23. The method of claim 22, wherein providing the capping layer includes depositing the semiconductor material of the capping layer in an intrinsic form, and doping the semiconductor material with the p-type dopant through ion implantation.

24. The method of claim 21, wherein the semiconductor material of the capping layer includes a group IV semiconductor material.

25. The method of claim 24, wherein the group IV semiconductor material of the capping layer includes germanium.

* * * * *